United States Patent [19]

Reavill

[11] 4,206,542
[45] Jun. 10, 1980

[54] SOLDER PREFORM LOADING METHOD AND APPARATUS

[75] Inventor: Joseph A. Reavill, Mira Loma, Calif.

[73] Assignee: General Dynamics Pomona Division, Pomona, Calif.

[21] Appl. No.: 4,389

[22] Filed: Jan. 18, 1979

Related U.S. Application Data

[62] Division of Ser. No. 886,215, Mar. 13, 1978, Pat. No. 4,164,064.

[51] Int. Cl.² ............................................ H01R 43/00
[52] U.S. Cl. ...................................................... 29/877
[58] Field of Search ................. 29/629, 747, 746, 429, 29/428, 626, 628; 414/675

[56] References Cited

U.S. PATENT DOCUMENTS

| | | | |
|---|---|---|---|
| 2,355,643 | 8/1944 | Grover | 29/428 |
| 3,414,962 | 12/1968 | Altamura | 29/746 X |
| 3,574,919 | 4/1971 | Reppert | 29/429 |
| 3,616,510 | 11/1971 | Kroehs | 29/747 |

Primary Examiner—Leon Gilden
Assistant Examiner—C. J. Arbes
Attorney, Agent, or Firm—Neil F. Martin; Edward B. Johnson

[57] ABSTRACT

A method and apparatus for loading solder preforms on to the pins of a multiple pin connector. A positioning plate has open sockets in the pattern of the pins of the connector to be loaded, the sockets being sized to receive a single solder preform in each one. A slidable retainer fits into a channel below the positioning plate to partially close the sockets and retain preforms therein. Loose preforms are contained in a dam attached to the top of the positioning plate and are shaken into the sockets on a vibrator table. The dam and excess preforms are removed and the positioning plate is covered by a cover plate to hold the preforms in place. The connector pins are then inserted through slots in the retainer, through the preforms and through holes in the cover plate. The retainer is removed, allowing the preforms to drop on the pins and the loaded connector is removed from the apparatus.

3 Claims, 9 Drawing Figures

SOLDER PREFORM LOADING METHOD AND APPARATUS

This is a division of application Ser. No. 886,215 filed Mar. 13, 1978 and now U.S. Pat. No. 4,164,064.

BACKGROUND OF THE INVENTION

In the assembly of multiple pin connectors to circuit boards and the like, it is necessary to have each pin properly soldered to the circuit connectors. To ensure uniformity in soldering it is a present practice to apply a solder preform to each pin and melt all the preforms simultaneously by heating the pins. Each preform is a small cylindrical section or toroid of solder material which must be placed over the individual pin. Since some connectors have well over a hundred pins, it can be a time consuming task to load the solder preforms. Tools and techniques have been developed to handle the very small preforms, but there is still a great deal of manual work and dexterity involved.

SUMMARY OF THE INVENTION

The apparatus described herein facilitates the loading of solder preforms simultaneously on all the selected pins of a multiple pin connector. A positioning plate has an array of open sockets corresponding to the arrangement of pins on the particular connector block to be loaded. A retainer slides into a channel in the underside of the positioning plate and partially blocks the sockets to hold solder preforms in place, the retainer having slots through which the connector pins can pass. Loose solder preforms are placed on the positioning plate and are confined by a dam attached to the positioning plate. The assembly is shaken on a vibrator table so that the preforms drop into the sockets. The dam and any excess preforms are them removed and a cover plate is placed over the positioning plate to hold the preforms in the sockets. The connector pins are inserted through the retainer and the preforms and through pin holes in the cover plate, after which the retainer is slid out of the channel, allowing the preforms to drop to the base of the connector pins. The connector is then removed with the preforms loaded on all the selected pins.

The primary object of this invention, therefore, is to provide a new and improved method and apparatus for loading solder preforms on the pins of a multiple pin connector.

Another object of this invention is to provide solder preform loading apparatus with means for holding preforms in a spaced array for simultaneous placement on the pins of a connector.

A further object of this invention is to provide solder preforms loading apparatus in which the preforms can be inserted in the holding means by vibration, requiring a minimum of time and manual dexterity.

Other objects and advantages will be apparent in the following detailed description in conjunction with the accompanying drawing, in which.

DESCRIPTION OF THE PREFERRED EMBODIMENT

Figure 1:
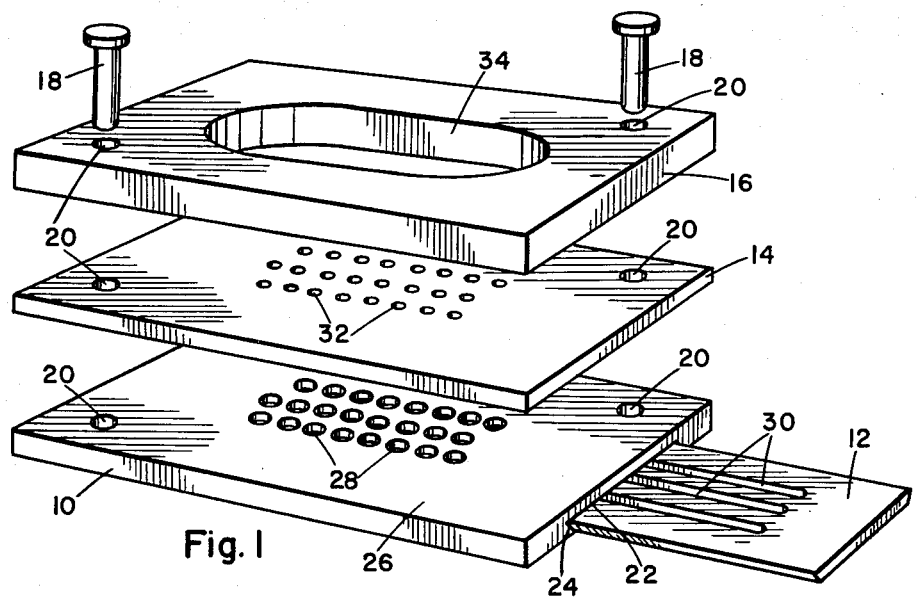
FIG. 1 is a perspective view of the separated components of the apparatus.
Figure 2:
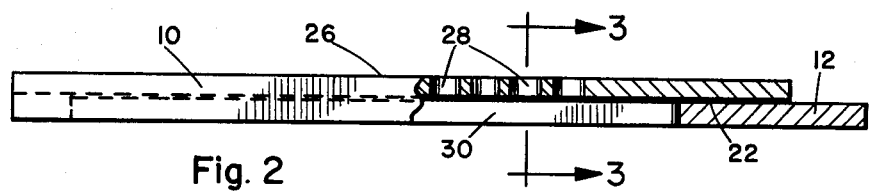
FIG. 2 is an enlarged side elevation view, partially cut away, of the positioning plate and slide retainer.

The apparatus is very simple and comprises a positioning plate 10, with a slidably interfitting retainer 12, a cover plate 14, a dam plate 16, and a pair of alignment pins 18. In FIG. 1, the components are illustrated in their relative alignment, but it should be understood that the dam plate 16 and cover plate 14 are not actually used together. All of the plates are shown as simple rectangular members, but could be of any configuration as required. Each plate is provided with a pair of tooling holes 20 for receiving the alignment pins 18, which hold the different plate combinations in alignment.

Positioning plate 10 has a channel 22 extending the full length thereof in the underside, the channel having dovetailed side walls 24 to hold the similarly shaped retainer 12 in sliding relation. In the top surface 26 of positioning plate 10 are sockets 28 arranged in a pattern corresponding to the layout of connector pins in the connector to be loaded. The sockets 28 extend through the positioning plate and open into channel 22. For all standard connectors, the sockets will be in parallel rows longitudinal to the channel.

Retainer 12 has a plurality of longitudinally extending slots 30, open at one end, the slots being spaced to align with the rows of sockets 28. Each slot 30 is narrower in width than the diameter of the sockets 28, but wide enough for the connector pins to pass through.

Cover plate 14 has an array of pin holes 32 corresponding to and axially aligned with the sockets 28. Pin holes 32 are smaller than sockets 28 and are sized to receive the connector pins.

Figure 3:
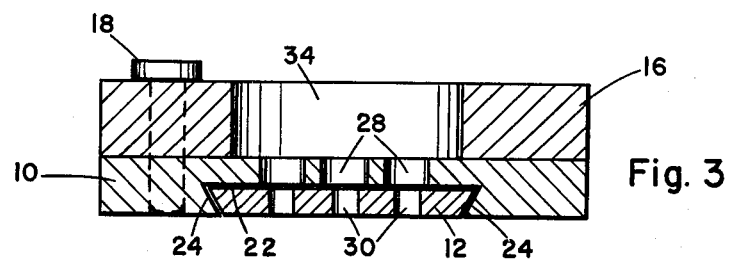
FIG. 3 is a further enlarged sectional view taken on line 3—3 of FIG. 2.
Figure 4:
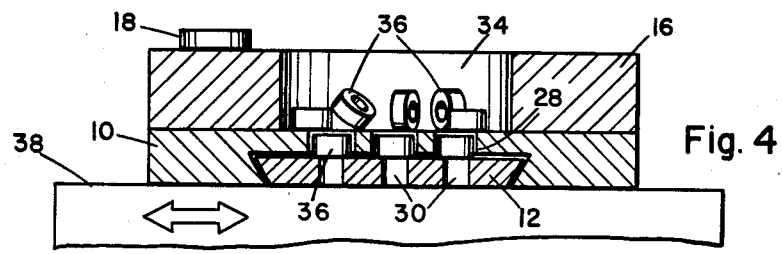
FIGS. 4 through 8 are sectional views similar to FIG. 3, illustrating the steps in the method of loading the preforms on a connector.

Dam plate 16 has an opening forming a well 34, large enough to expose the entire array of sockets 28 when the dam plate is attached to positioning plate 10, as in FIG. 3. In this initial assembly, held by alignment pins 18, loose solder preforms 36 are placed in the well 34, as indicated in FIG. 4.

Each solder preform 36 is a small cylindrical section or toroid of solder material of sufficient volume to form a good solder connection. A typical preform is on the order of 0.058 inch outside diameter, with a 0.03 diameter bore and is 0.03 thick, but the size can vary to suit the pin diameter and contact arrangement.

The assembly is placed on a vibrator table 38, or other vibratory support, which shakes the preforms 36 until they settle into sockets 28. Each socket is just large enough to hold a single preform in axial alignment, the preforms being held in the sockets by retainer 12.

Figure 5:
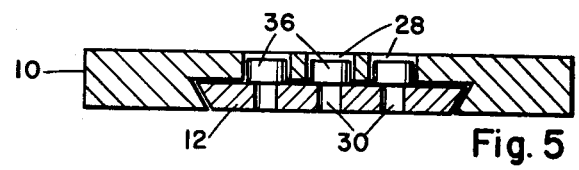
Figure 6:
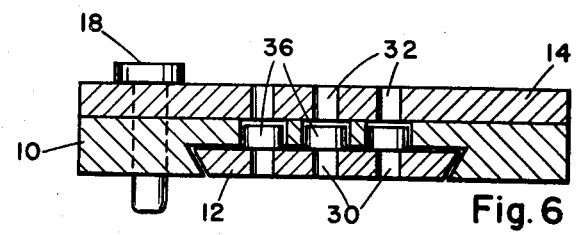

The dam plate 16 is removed, leaving the positioning plate 10 loaded with preforms 36, as in FIG. 5. To secure the preforms, the cover plate 14 is placed over the top of positioning plate 10 and held by alignment pins 18, as in FIG. 6, trapping the preforms in their sockets.

Figure 7:
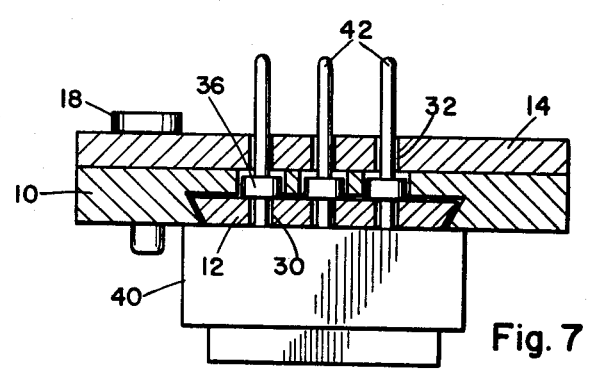
Figure 8:
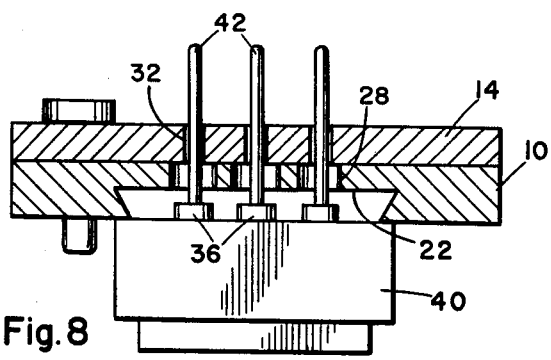

A connector 40 is then loaded by inserting its pins 42 through slots 30, through the preforms 36 and out through pin holes 32, as in FIG. 7. The retainer 12 is then slid out, as in FIG. 8, allowing the preforms 36 to drop from the sockets 28 to the base of the respective pins 42.

Figure 9:
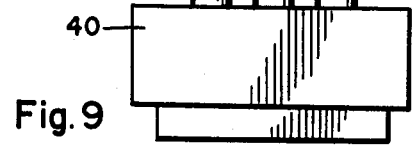
FIG. 9 is an end elevation view of a typical connector with the preforms in place.

Connector 40 is then removed from the apparatus with a solder preform 36 on each pin 42, as indicated in FIG. 9. All the preforms are thus loaded simultaneously without requiring any manual placement, which would be difficult due to the small size of the preforms.

If certain of the pins 42 are not to be soldered, the respective sockets 28 can be partially plugged to avoid receiving preforms. On the positioning plate 10 can be initially set up by drilling smaller pin holes instead of sockets where the preforms are not required.

The apparatus facilitates the loading of preforms on very closely spaced pins. In some connectors, the pins in adjacent rows are staggered and the rows are so close together that the preforms interfit with very small separation. The slotted retainer 12, which resembles a comb, will accommodate very close row spacing, because the slots can be made with minimum separation. Since multiple pin connectors are normally made with the pins arranged in rows for uniformity and convenience, the slidable retainer makes the apparatus adaptable to substantially all types of multiple pin connectors.

I claim:

1. A method of loading solder preforms on the pins of a multiple pin connector, comprising:

preparing a positioning plate having a plurality of open sockets in a pattern corresponding to the pins of the connector to be loaded, attaching to the positioning plate a retainer which partially closes the sockets on one side, placing in each socket a substantially toroidal solder preform, inserting the pins of the connector through the retainer and through the solder preforms in the sockets, removing the retainer, allowing the solder preforms to drop onto the connector pins, and removing the positioning plate from the connector.

2. The method of claim 1, wherein the stop of placing the solder preforms in the sockets includes attaching to the positioning plate a dam plate having a well which exposes the sockets, placing a plurality of loose solder preforms in the well, and vibrating the plate assembly to distribute the solder preforms in the sockets.

3. The method of claim 1, and including, after the step of placing the solder preforms in the sockets, the additional step of attaching to the positioning plate a cover plate having connector pin receiving holes in a pattern corresponding to the sockets, so that the solder preforms are enclosed in the sockets prior to insertion of the connector pins.

* * * * *